United States Patent
Shimizu et al.

(10) Patent No.: US 12,459,724 B2
(45) Date of Patent: Nov. 4, 2025

(54) STORAGE CASE

(71) Applicant: Murata Manufacturing Co., Ltd., Nagaokakyo (JP)

(72) Inventors: Yasuhiro Shimizu, Nagaokakyo (JP); Kiyoyuki Nakagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 218 days.

(21) Appl. No.: 18/088,816

(22) Filed: Dec. 27, 2022

(65) Prior Publication Data

US 2023/0132218 A1   Apr. 27, 2023

Related U.S. Application Data

(63) Continuation of application No. PCT/JP2021/023093, filed on Jun. 17, 2021.

(30) Foreign Application Priority Data

Jul. 7, 2020 (JP) .................. 2020-117206

(51) Int. Cl.
*B65D 83/04* (2006.01)
*B65D 25/38* (2006.01)
*H05K 13/08* (2006.01)

(52) U.S. Cl.
CPC .............. *B65D 83/04* (2013.01); *B65D 25/38* (2013.01); *H05K 13/086* (2018.08)

(58) Field of Classification Search
CPC ........................................ B65D 83/04
USPC ........................................ 221/303, 309, 312
See application file for complete search history.

(56) References Cited

U.S. PATENT DOCUMENTS

| | | | |
|---|---|---|---|
| 6,032,783 A | 3/2000 | Saito et al. | |
| 6,202,890 B1 | 3/2001 | Morita et al. | |
| 6,685,052 B1 | 2/2004 | Nemoto et al. | |
| 6,902,062 B1 * | 6/2005 | Kumakura ............. | B65D 71/36 206/703 |
| 7,134,571 B2 * | 11/2006 | Hochtritt .............. | A47K 10/424 221/241 |

(Continued)

FOREIGN PATENT DOCUMENTS

| CN | 101930689 A | 12/2010 |
|---|---|---|
| CN | 209988360 U | 1/2020 |

(Continued)

OTHER PUBLICATIONS

Official Communication issued in corresponding European Patent Application No. 21837978.2, mailed on Jun. 25, 2024, 10 pages.

(Continued)

*Primary Examiner* — Gene O Crawford
*Assistant Examiner* — Ayodeji T Ojofeitimi
(74) *Attorney, Agent, or Firm* — Keating & Bennett, LLP (57) ABSTRACT

A storage case includes a storage space in which a component is to be accommodated, and is attached to a feeder to supply the component to a mounting device, the storage case includes a component takeout port in a side wall and extending in a vertical direction when the storage case is attached to the feeder, and an inclined surface within the storage space and extending to a lower edge of the component takeout port, which is at a bottom of the component takeout port when the storage case is attached to the feeder.

13 Claims, 5 Drawing Sheets

(56) References Cited

U.S. PATENT DOCUMENTS

| | | | | |
|---|---|---|---|---|
| 2015/0332536 A1* | 11/2015 | Dial, III | ............... | G07F 7/08 |
| | | | | 221/13 |
| 2016/0008226 A1* | 1/2016 | Hines | ............... | A61J 7/0481 |
| | | | | 221/121 |
| 2016/0130071 A1* | 5/2016 | Li | ............... | B65D 85/60 |
| | | | | 221/174 |

FOREIGN PATENT DOCUMENTS

| | | |
|---|---|---|
| CN | 210361858 U | 4/2020 |
| EP | 0735812 A1 | 10/1996 |
| JP | S51121309 U | 10/1976 |
| JP | S57199509 U | 12/1982 |
| JP | S63137787 U | 9/1988 |
| JP | H0738289 B2 | 4/1995 |
| JP | H10190290 A | 7/1998 |
| JP | H1117391 A | 1/1999 |
| JP | 2000349496 A | 12/2000 |
| JP | 2001196791 A | 7/2001 |
| JP | 2001287827 A | 10/2001 |
| JP | 2004323183 A | 11/2004 |
| JP | 2009295618 A | 12/2009 |
| WO | 2016046897 A1 | 3/2016 |

OTHER PUBLICATIONS

Office Action in JP2022-534993, mailed Mar. 28, 2023, 3 pages.
International Search Report in PCT/JP2021/023093, mailed Sep. 7, 2021, 3 pages.
Written Opinion in PCT/JP2021/023093, mailed Sep. 7, 2021, 4 pages.

\* cited by examiner

STORAGE CASE

CROSS REFERENCE TO RELATED APPLICATIONS

This application claims the benefit of priority to Japanese Patent Application No. 2020-117206 filed on Jul. 7, 2020 and is a Continuation Application of PCT Application No. PCT/JP2021/023093 filed on Jun. 17, 2021. The entire contents of each application are hereby incorporated herein by reference.

BACKGROUND OF THE INVENTION

1. Field of the Invention

The present invention relates to a storage case of electronic components.

2. Description of the Related Art

When mounting an electronic component on a board, a mounting device is used that installs and mounts the electronic component at a predetermined position on the board. To such a mounting device, electronic components need to be supplied individually.

An example of a method of individually supplying the electronic components to the mounting device is a tape feeder method of burying the electronic components inside a tape-shaped conveyor and taking out the components one by one. However, the tape feeder method generates waste, such as tapes and tape covers.

On the other hand, another example of the method is a method of providing, into a storage case, electronic components in a bulk state, dropping the electronic components down to a feeder using their own weights through a component takeout port formed in a bottom portion of the storage case, and individually supplying the components to the mounting device with the feeder (see, for example, Japanese Unexamined Patent Application, Publication No. 2009-295618). In this method, no waste, such as tapes and tape covers, is generated.

However, when dropping down electronic components using their own weights through a component takeout port formed in a bottom portion of a storage case and if the component takeout port in the bottom portion is large, the components may flow out all at once.

On the other hand, when the component takeout port is reduced in size to set the number of electronic components flowing out per unit time to a desired number and when an amount of the electronic components in the storage case is large, clogging may occur at the component takeout port. For this reason, it is necessary to limit the electronic components to an amount that prevents the storage case from being easily clogged with the components.

However, if the amount of the electronic components is limited, the amount of the electronic components that can be provided in the storage case might be small, which is not suitable for mass production.

SUMMARY OF THE INVENTION

Preferred embodiments of the present invention provide storage cases that each, regardless of the number of electronic components stored therein, prevent a component takeout port from being easily clogged with the electronic components and prevents the electronic components from flowing out all at once.

A preferred embodiment of the present invention provides a storage case including a storage space in which a component is to be located, the storage case being attached to a feeder that supplies the component to a mounting device, the storage case including a component takeout port in a side wall and extending in a vertical direction when the storage case is attached to the feeder, and an inclined surface within the storage space and extending to a lower edge of the component takeout port, which is on a lower side of the component takeout port when the storage case is attached to the feeder.

Preferred embodiments of the present invention provide storage cases that each, regardless of the number of electronic components stored therein, prevent a component takeout port from being easily clogged with the electronic components and prevent the electronic components from flowing out all at once.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings.

Figure 1:
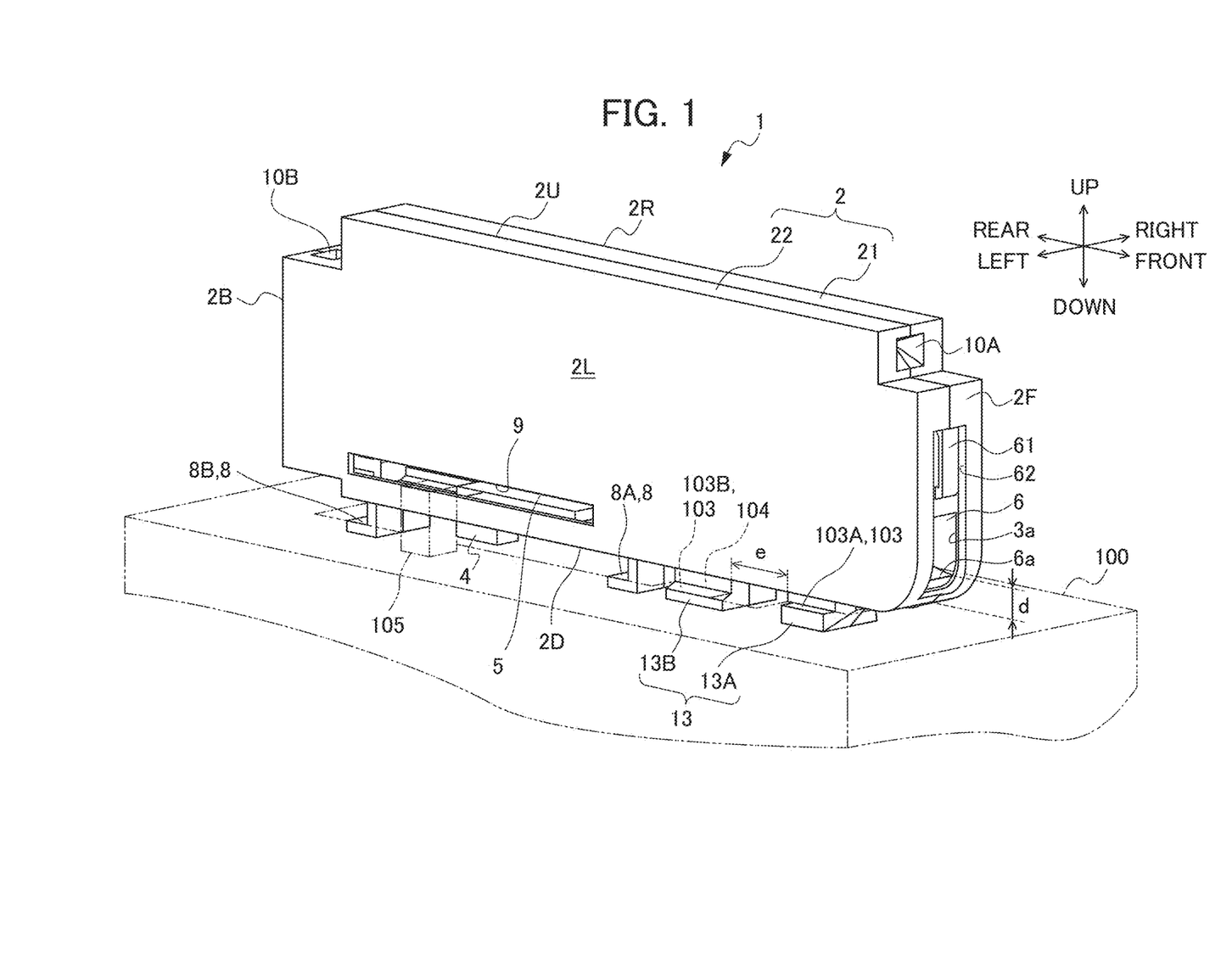
FIG. 1 is a perspective view of a storage case according to a preferred embodiment of the present invention seen diagonally from an upper side, showing a state where a component takeout port is opened.

Hereinafter, a storage case 1 according to a preferred embodiment of the present invention will be described with reference to the drawings. FIG. 1 is a perspective view of the storage case 1 seen diagonally from an upper side. The storage case 1 is attachable to and detachable from a feeder 100 indicated by a dotted line, in which electronic components 50 (illustrated in FIG. 2) are stored in a bulk state as an example of components inside. The feeder 100 is a device that supplies, to a mounting device (not illustrated), the electronic components 50 flowing out of the storage case 1.

In the present preferred embodiment, each of the electronic components 50 is, for example, a capacitor, an inductor, or the like, and has a length of, for example, about 1.2 mm or less in a longitudinal direction. The electronic component 50 has a rectangular or substantially rectangular parallelepiped shape.

Figure 2:
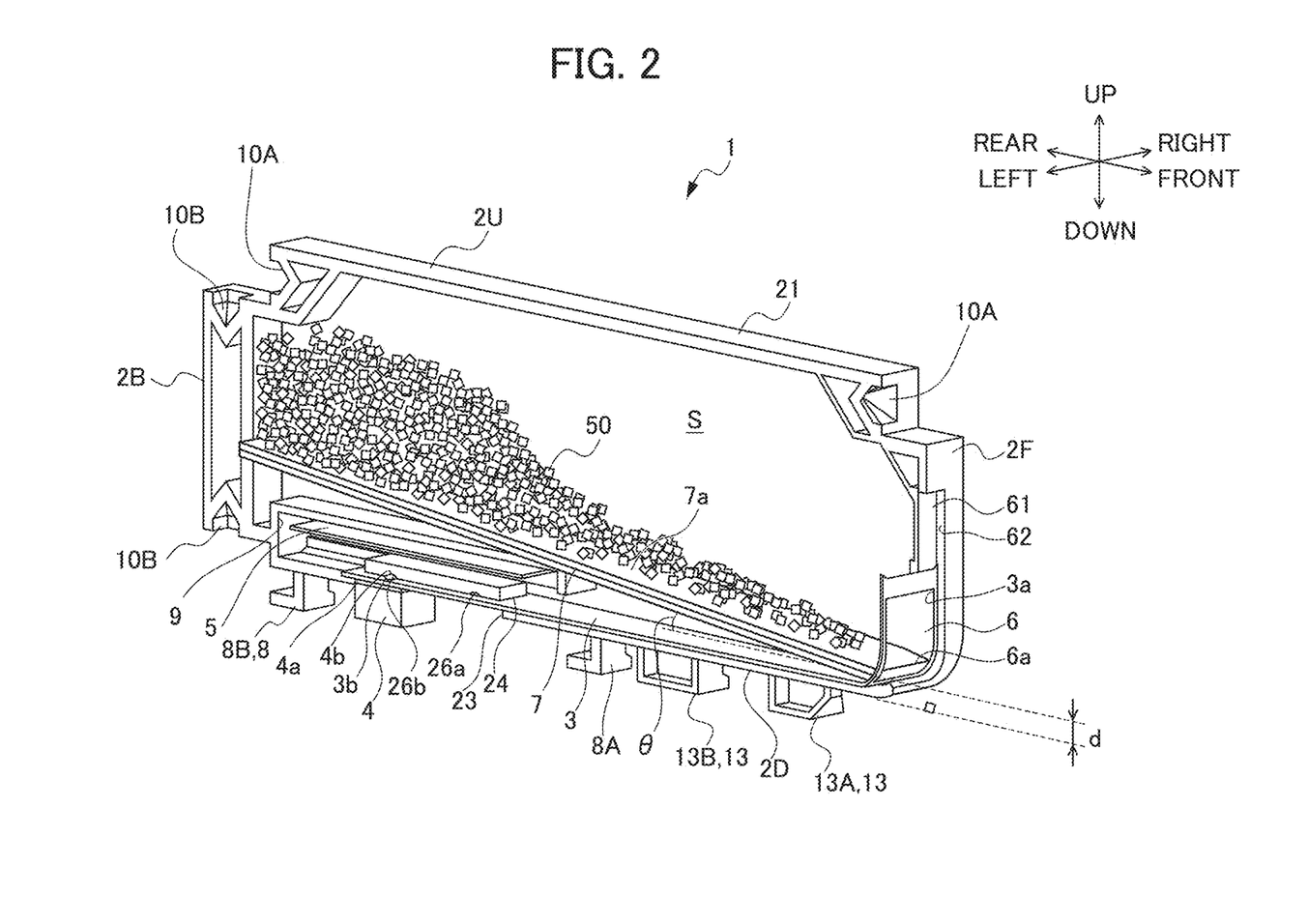
FIG. 2 is a perspective view showing an internal state the storage case in FIG. 1, showing the state where a component takeout port is opened.
Figure 3:
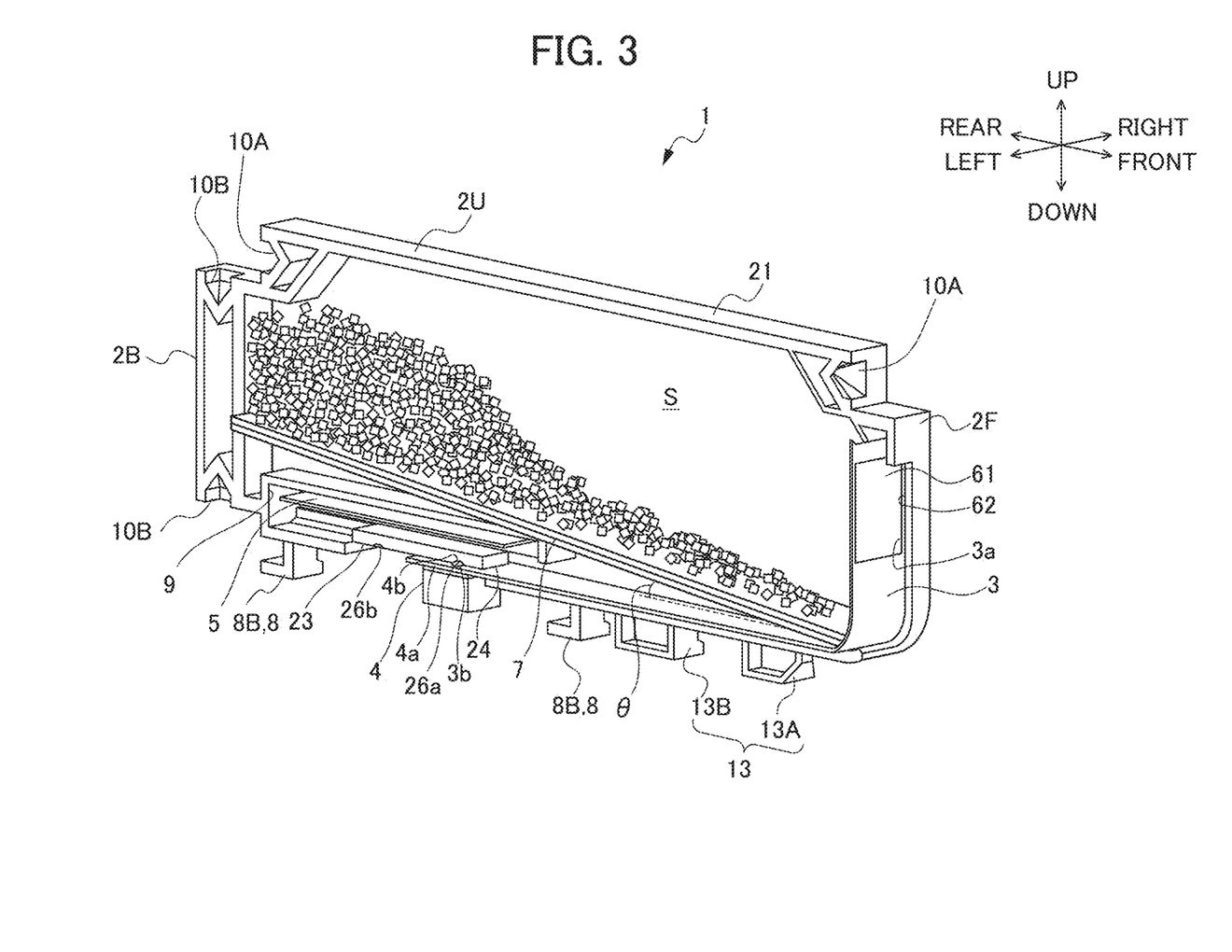
FIG. 3 is a perspective view showing the internal state of the storage case in FIG. 1, showing a state where the component takeout port is closed.
Figure 4:
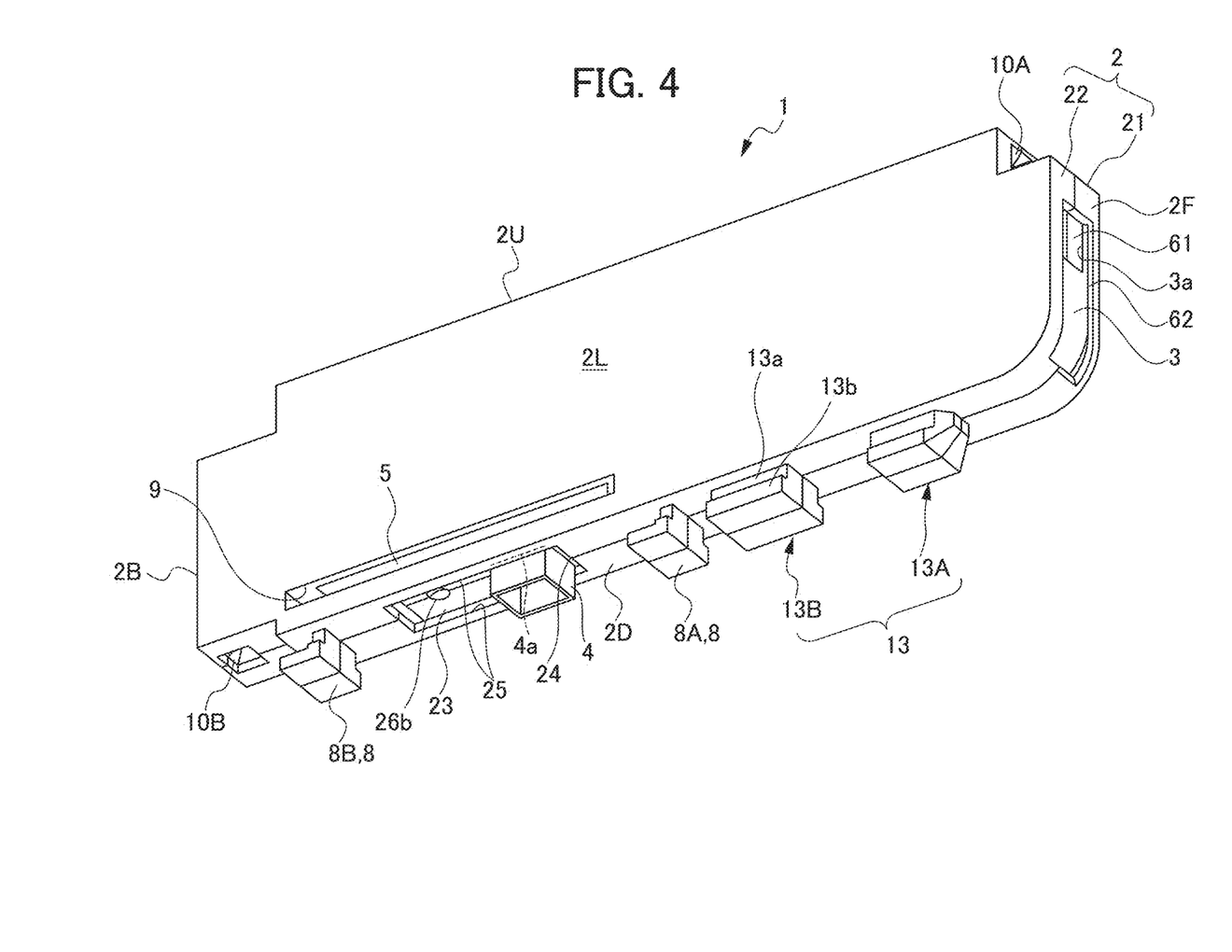
FIG. 4 is a perspective view of the storage case in FIG. 1 seen diagonally from a lower side, showing the state where the component takeout port is closed.
Figure 5A:
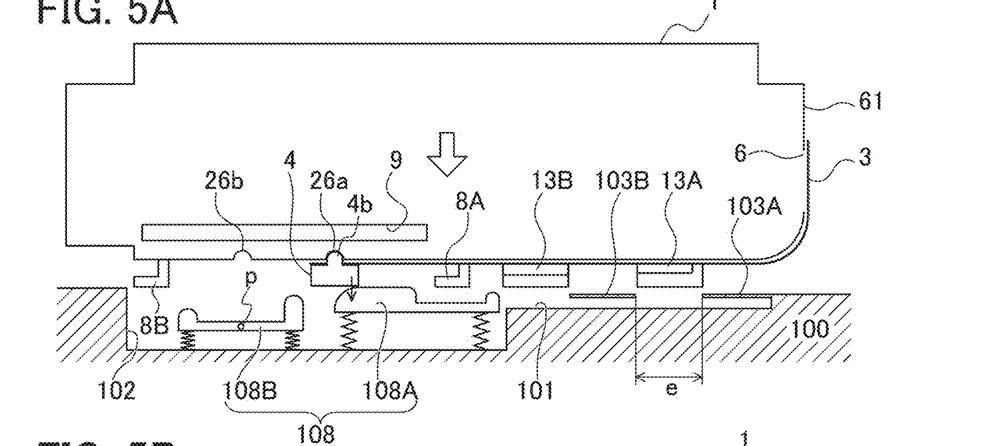
FIGS. 5A to 5D show explanatory views of a method of attaching the storage case to a feeder.
Figure 5B:
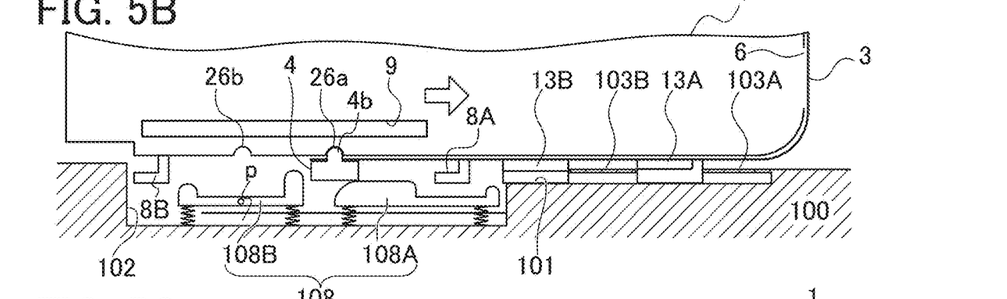
Figure 5C:
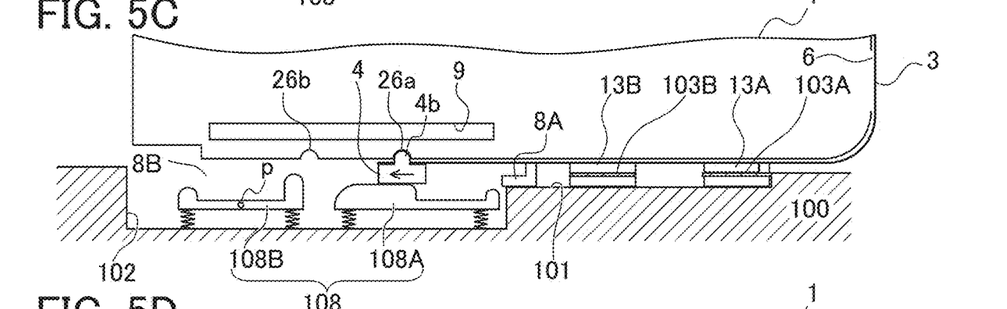

FIG. 2 is a perspective view showing an internal state of the storage case 1 from which a second side wall portion 22 is removed, showing a state where a component takeout port 6 is opened. FIG. 3 is a perspective view showing the internal state of the storage case 1 from which the second side wall portion 22 is removed in the same manner as in FIG. 2, showing the state where the component takeout port 6 is closed. FIG. 4 is a perspective view of the storage case 1 seen diagonally from a lower side. FIGS. 5A to 5C show explanatory views of a method of attaching the storage case 1 to the feeder 100.

Storage Case

The storage case 1 includes a case body 2, a cover 3, a driver 4, and an RFID tag 5.

Case Body

The case body 2 is a container including a first side wall 21 and the second side wall 22, and the first side wall 21 and the second side wall 22 are assembled to define a storage space S inside. The case body 2 includes an upper wall 20, a bottom wall 2D, a front wall 2F, a rear wall 2B, a right wall 2R on a first side wall 21 side, and a left wall 2L on a second side wall 22 side. Inside the storage case 1, the electronic components 50 are stored in a bulk state.

In the present description, when the storage case 1 is attached to the feeder 100, up and down directions of a vertical direction are up and down directions of the storage case 1. Further, in the storage case 1, a side on which the component takeout port 6 is provided is a front side and the opposite side is a rear side. A right side of the storage case 1 when seen from the front is the right and a left side is the left. The first side wall 21 is located on the right side, and the second side wall 22 is located on the left side.

The front wall 2F, the rear wall 2B, the right wall 2R and the left wall 2L are side walls extending in the vertical direction, that is, up and down. The upper wall 2U and the bottom wall 2D are walls extending in a horizontal direction.

Component Takeout Port

The component takeout port 6 is provided on a lower side of the front wall 2F of the case body 2. The component takeout port 6 is a quadrangular or substantially quadrangular opening in the present preferred embodiment, but is not limited to a quadrangular shape, and may be an opening having another shape, for example, a circular or substantially circular shape or an elliptical or substantially elliptical shape. A position of a lower edge 6a when the component takeout port 6 is opened is, for example, spaced apart by a predetermined distance d=about 3 mm to about 6 mm from a bottom surface of the bottom wall 2D on a feeder 100 side towards the upper side in the vertical direction.

Inclined Surface

In the storage space S, a plate 7 extends between the first side wall 21 and the second side wall 22. An upper surface of the plate 7 is an inclined surface 7a that extends from the rear toward the lower edge 6a of the component takeout port 6 in front and that is inclined with a lower edge 6a side being a lowermost side.

An inclination angle θ of the inclined surface 7a is, for example, from about 3° to about 10° with respect to the horizontal direction when the storage case 1 is fitted to the feeder 100 and is, for example, about 5° in the present preferred embodiment. The angle is even better from, for example, about 5° to about 7°.

Cover

The cover 3 covering the component takeout port 6 extends continuously from the bottom wall 2D to the front wall 2F. The cover 3 is a long strip-shaped member, and a material is not limited thereto, but is, for example, polyethylene terephthalate (PET) in the present preferred embodiment and is a bendable material having rigidity to a certain degree. A width of the cover 3 is slightly larger than a width of the component takeout port 6 and is a width that can cover the component takeout port 6 without any gaps. The width is from, for example, about 1.0×10^6 to about 1.0× 10^12 (about $1.0 \times 10^6$ to about $1.0 \times 10^{12}$). If it falls below about 1.0×10^6, component damage due to a voltage rapidly occurs, and if it exceeds about 1.0×10^12, component adhesion due to static electricity occurs.

The cover 3 includes a front end provided with an opening 3a having the same or substantially the same shape as the component takeout port 6. The opening 3a does not need to have the same or substantially the same shape as the component takeout port 6, but an opening that penetrates when the opening 3a and the component takeout port 6 overlap becomes an outlet of the electronic component 50.

Guide Groove

On the other hand, a cover sliding concave portion 61 recessed from outside toward inside is provided on the upper side of the component takeout port 6 in the front wall 2F of the case body 2.

Guide grooves 62 extending up and down are provided on the left and right of a side surface of a portion provided with the component takeout port 6 and the cover sliding concave portion 61 in a thickness direction of the front wall 2F.

A difference between a width of each guide groove 62 and a thickness of the cover 3 is, for example from about 50 μm to about 80 μm.

Opposite sides of the cover 3 extending in the longitudinal direction are inserted into the left and right guide grooves 62. The cover 3 is guided by the guide grooves 62 and slides along the front wall 2F in an up-down direction.

Driver

The cover 3 includes a rear end provided with a circular or substantially circular hole 3b shown in FIGS. 2 and 3. The driver 4 that drives and slides the cover 3 is fitted to the hole 3b. The driver 4 is a rectangular or substantially rectangular member and includes a flange 4a extending outward to the left and right on the upper side. A convex portion 4b is provided on an upper surface of the driver 4, and the convex portion 4b is inserted into the hole 3b of the cover 3 and protrudes upward.

On the other hand, as shown in FIG. 4, a driver sliding concave portion 23 recessed from the outside toward the inside is provided on the bottom wall 2D of the storage case 1. On a front surface of the driver sliding concave portion 23, a long hole 24 is provided into which the cover 3 can be inserted from an inner surface side to an outer surface side of the bottom wall 2D. The cover 3 extends through the long hole 24 to the outer surface side that is a bottom surface of the driver sliding concave portion 23. On an outer surface of the driver sliding concave portion 23, two recesses 26a and 26b are provided alongside in a front-rear direction.

On side surfaces of a portion provided with the driver sliding concave portion 23 in the thickness direction of the bottom wall 2D, driving groove portions 25 extending in the front-rear direction as shown in FIG. 4 are provided on the left and right sides. The flange portion 4a of the driver 4 is inserted between the left and right driving groove portions 25. When the driver 4 is moved back and forth by an operator or another device, the driver is guided by the driving groove portions 25 and slides in the driver sliding concave portion 23 in the front-rear direction. At this time, a slide range of the driver 4 is between a position where the convex portion 4b fits into the front recess 26a and a position where the convex portion fits into the rear recess 26b.

FIGS. 5A and 5C will be described later in detail. As shown in FIGS. 5C and 3, when the convex portion 4b of the driver 4 is in the front recess 26a, the opening 3a of the cover 3 is located in the cover sliding concave portion 61 and does not overlap with the component takeout port 6. The whole component takeout port 6 is closed, and the electronic component 50 is not released to the outside.

Figure 5D:
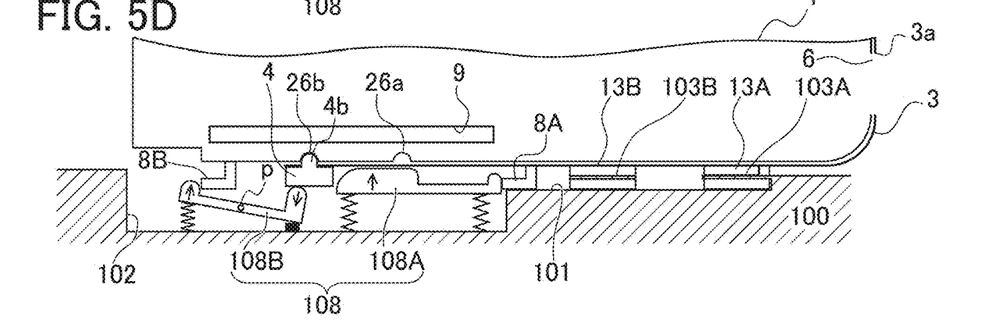

As shown in FIGS. 5D and 2, when the convex portion 4b of the driver 4 is in the rear recess 26b, the opening 3a of the cover 3 overlaps with the component takeout port 6 and opens the component takeout port 6. The electronic component 50 can be taken out.

Gripping Portion

On rear and upper sides of the case body 2, gripping portions 10 are provided. The gripping portions 10 include two types, an upper gripping portion 10A and a rear gripping portion 10B in the present preferred embodiment, but is not limited thereto, and may be one of them, or may be provided at other locations, such as left and right, or up and down in front.

The upper gripping portion 10A includes recesses provided at both front and rear ends of the upper side of the case body 2. The rear gripping portion 10B includes recesses provided at both upper and lower ends of the rear side of the case body 2. The gripping portion 10 is used, for example, during conveying, because the component is gripped with a robot hand or the like.

RFID Tag

The case body 2 further includes a through hole 9 that penetrates left and right downward. The RFID tag 5 is stuck to an inner upper surface of the through hole 9. The RFID tag 5 is a known one including a transmitter/receiver, a memory, an antenna, and the like. The hole does not necessarily have to be the through hole and may only be able to include the RFID tag, and the RFID tag may be affixed to the case body.

On the other hand, as shown in FIG. 1, a reader/writer 105 is fitted on the feeder 100 side. The reader/writer 105 can read or write information on the RFID tag 5 when the storage case 1 is attached to the feeder 100.

The case body 2 is further provided with portion to be locked 8 and a T-shaped slot 13 that extend downward from the outer surface of the bottom wall 2D.

Portion to be Locked

The portion to be locked 8 may include two portions, a front portion to be locked 8A and a rear portion to be locked 8B in the present preferred embodiment, but is not limited thereto, and may be one portion. Hereinafter, portions common to the front portion to be locked 8A and the rear portion to be locked 8B will be collectively described as the portion to be locked 8.

The portion to be locked 8 extends from top to bottom, includes a lower end bent rearward at approximately 90° and has an L-shape in a cross section extending up, down, left and right.

T-Shaped Slot

The T-shaped slot 13 includes two portions of a front T-shaped slot 13A and a rear T-shaped slot 13B in the present preferred embodiment, but is not limited thereto, and may be one slot.

However, by dividing the portion into a plurality of portions, a slide distance of the storage case 1 when attached to the feeder 100 can be shortened. Hereinafter, common portions to the front T-shaped slot 13A and the rear T-shaped slot 13B will be collectively described as the T-shaped slot 13.

As shown in FIG. 4, the T-shaped slot 13 includes a thin neck portion 13a extending from top to bottom, and a wide portion 13b provided below the thin neck portion 13a and has a T-shape in a cross section extending up, down, left and right.

Feeder Side

As shown in FIGS. 5A to 5C, the feeder 100 is provided with a first attaching concave portion 101 and a second attaching concave portion 102 recessed downward from an upper surface of the feeder 100.

First Attaching Concave Portion

The first attaching concave portion 101 provided in the front has a left-right width that is a width in which the wide portion 13b of the T-shaped slot 13 can be inserted and has an up-down depth that is larger than a length of the wide portion 13b in the up-down direction and that is smaller than an overall length of the front T-shaped slot 13A in the up-down direction.

In two upper locations of the first attaching concave portion 101, the wide portion 13b of the T-shaped slot is not insertable, but the thin neck portion 13a is provided with a pressing plate 103 provided with a slit 104 having an insertable width as shown in FIG. 1. An upper surface of the pressing plate 103 is a horizontal surface continuous from the upper surface of the feeder 100 and is provided with a front pressing plate p103A and a rear pressing plate 103B. A front-rear length of a gap e between the front pressing plate 103A and the rear pressing plate 103B shown in FIG. 5A is a length into which the front T-shaped slot 13A can be inserted.

Lock

The second attaching concave portion 102 is deeper than the first attaching concave portion 101, and a lock 108 is provided inside. In the present preferred embodiment, the lock 108 includes a front lock 108A and a rear lock 108B corresponding to the front portion to be locked 8A and the rear portion to be locked 8B, respectively.

Front Lock

The front lock 108A is a plate-shaped member provided with front and rear protrusions directed upward.

A front and rear of a bottom surface of the front lock 108A are fitted via springs relative to a bottom portion of the second attaching concave portion 102. The front lock 108A can be moved up and down by this spring.

Rear Lock

The rear lock 108B is a plate-shaped member provided with front and rear protrusions directed upward. A front and rear of a bottom surface of the rear lock 108B are fitted via springs relative to the bottom portion of the second attaching concave portion 102. A central portion of the rear lock 108B is pivotally supported on a shaft p extending to the left and right. The rear lock 108B can swing about the shaft.

Attaching Operation

Next, an operation of attaching the storage case 1 to the feeder 100 will be described.

Inside the storage case 1, a large number of electronic components 50 are stored in a bulk state, and the component takeout port 6 is closed. At this time, the convex portion 4b of the driver 4 is in the front recess 26a, and the entire component takeout port 6 is closed with the opening 3a of the cover 3.

As indicated by a white arrow in FIG. 5A, the storage case 1 in this state is brought close to the feeder 100 side so that the front T-shaped slot 13A of the storage case 1 is inserted into the gap between the front pressing plate 103A and the rear pressing plate 103B.

Then, from the gap e between the front pressing plate 103A and the rear pressing plate 103B, the front T-shaped slot 13A of the storage case 1 is inserted into the first attaching concave portion 101. At the same time, the rear T-shaped slot 13B of the storage case 1 is inserted into the first attaching concave portion 101 from behind the rear pressing plate 103B.

At this time, the front lock 108A is pushed by the driver 4 and pressed down against a spring force.

The front lock 108A descends without rotating.

Next, the storage case 1 is entirely slid to the front as indicated by a white arrow in FIG. 5B.

Then, the front T-shaped slot 13A and the rear T-shaped slot 13B slide along a bottom surface of the first attaching concave portion 101. The wide portion 13b of the front T-shaped slot 13A enters below the front pressing plate 103A, and the wide portion 13b of the rear T-shaped slot 13B enters below the rear pressing plate 103B. Thus, the storage case 1 is fixed to the feeder 100.

The storage case 1 is positioned on the feeder 100 when a front surface of the front T-shaped slot 13A abuts on a front surface of the first attaching concave portion 101.

In this state, the reader/writer 105 shown in FIG. 1 can read the information on the RFID tag 5. Since the RFID tag 5 is disposed inside the through hole 9, the tag is difficult to peel off and is unlikely to be damaged even during transportation and the like. An information containing member may be described with a barcode including two dimensions, or an identification character or mark. Information corresponding to the identification character or mark may be provided on a reading side, and the identification character or mark provided in the information containing member is read and then connected to the data contained on the reading side, so that the electronic components and information contained in the present case are transmitted to the feeder 100 side.

Next, when the driver 4 is moved rearward as shown in FIG. 5C, the opening 3a of the cover 3 overlaps with the component takeout port 6, and the component takeout port 6 opens.

At this time, as shown in FIG. 5D, the front protrusion of the rear lock 108B is pushed downward by the driver 4. The rear lock 108B rotates about the shaft p and the rear protrusion of the rear lock 108B rises. The rear protrusion abuts on an L-shaped rear end of the rear portion to be locked 8B.

Moreover, when the driver 4 moves rearward, the pressing of the front lock 108A that has been pressed by the driver 4 is released. Then, the front lock 108A rises due to a restoring force of the spring, and a protrusion at a front end of the front lock 108A abuts on an L-shaped rear end of the front portion to be locked 8A.

In this way, the rear lock 108B locks the rear portion to be locked 8B, and the front lock 108A locks the front portion to be locked 8A. Therefore, when the cover 3 opens the component takeout port 6, the storage case 1 is not removed from the feeder 100.

In this state, the electronic component 50 slides down along the inclined surface 7a and is released from the component takeout port 6. At this time, the number of the electronic components 50 flowing out per unit time can be controlled by the angle of the inclined surface 7a, and thus a supply speed of the electronic component 50 can be controlled.

The released electronic component 50 is conveyed to a predetermined place by a conveyor (not shown) provided in the feeder 100.

Unlike the present preferred embodiment, when the electronic components 50 fall down using their own weights in the vertical direction, the component falls down all at once. Therefore, the component takeout port 6 might be clogged with the electronic components 50.

However, in the present preferred embodiment, since the number of the electronic components 50 flowing out per unit time can be controlled, regardless of the number of the electronic components 50 stored therein, the component takeout port 6 is not easily clogged with the electronic components 50 and the electronic components do not flow out all at once.

Further, a thickness of the electronic component 50 in the thinnest direction is, for example, from about 90 μm to about 700 μm and is larger than a range of about 50 μm to about 80 μm, which is a difference between the width of the guide groove 62 and the thickness of the cover 3. Therefore, when the electronic components 50 are released, electronic components do not enter a gap between the guide groove 62 and the cover 3. The length of the electronic component 50 in the longitudinal direction more preferably has a size of, for example, about 180 μm to about 330 μm.

In the present preferred embodiment, a position of the lower edge 6a when the component takeout port 6 is opened is spaced apart by the predetermined distance d from the bottom surface of the bottom wall 2D on the feeder 100 side to the upper side in the vertical direction. Therefore, the electronic component 50 that has flowed out does not flow backward to the component takeout port 6 from the unillustrated conveyor on the feeder 100 on which the component falls down.

When the component takeout port 6 is opened, as shown in FIG. 2, at least the lower edge 6a of the component takeout port 6 is above a lower edge of the opening 3a of the cover 3. Therefore, when the electronic component 50 flows out, the component is caught on the lower edge of the opening 3a of the cover 3 and is not hindered from flowing out.

Since the storage case 1 of the present preferred embodiment is provided with the gripping portion 10, the case can be set on the feeder 100 by use of an automatic robot arm or the like.

Since the case body 2 includes the RFID tag 5 and the reader/writer 105 is fitted on the feeder 100 side, the reader/writer 105 can read the information on the RFID tag 5. Therefore, it is easy to manage the electronic component 50 in the storage case 1.

MODIFIED EXAMPLES

As described above, preferred embodiments of the present invention have been described, but is not limited thereto, and can be variously changed.

For example, in the present preferred embodiment, the T-shaped slot 13 is provided and the first attaching concave portion 101 is provided in the feeder 100, which is not limited thereto. The T-shaped slot may be provided in the feeder, and a first concave portion may be provided in the storage case.

Further, the portion to be locked 8 is provided in the storage case 1 and the lock 108 is provided in the feeder 100, which is not limited thereto. The portion to be locked may be provided in the feeder 100 and the lock may be provided in the storage case 1.

A vibration device that vibrates the storage case 1 may be provided separately in the feeder 100. In this case, for example, when a release rate of the electronic component 50 is reduced, the storage case 1 can be vibrated by the vibration device to improve the release rate.

In the present preferred embodiment, the inclined surface 7a is a flat surface, but is not limited thereto, and may be, for example, a curved surface or the like. In this case, a curve may be provided in a vertical front-to-rear cross section, or a curve may be provided in a vertical left-to-right cross section. Further, a combination of straight lines having different inclinations may be provided in the vertical front-to-rear cross section and the vertical left-to-right cross section. Furthermore, a combination of these curves and straight lines may be provided.

A structure of the lock and the portion to be locked is not limited to such a structure as in the present preferred embodiment. Another structure may be provided as long as the removal of the storage case 1 from the feeder 100 is regulated when the component takeout port 6 is opened.

The RFID tag 5 may be disposed at a location other than the through hole 9. Further, in place of the RFID tag 5, a medium in which externally readable information is recorded may be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A storage case including a storage space in which a component is to be accommodated, the storage case comprising:
    at least one side wall;
    a component takeout port in only one side wall of the at least one sidewall;
    an inclined surface within the storage space and extending toward the component takeout port;
    a cover that slides along the component takeout port to open and close the component takeout port;
    a guide groove in the side wall to guide a sliding movement of the cover; and
    a driver to drive and slide the cover, in an outer wall other than the side wall; wherein the inclined surface is flat or substantially flat;
    a difference between a width of the guide groove and a thickness of the cover is about 50 μm to about 80 μm;
    the cover includes a circular or substantially circular hole in a rear end thereof; and
    the driver is fitted to the hole.

2. The storage case according to claim 1, wherein the driver includes a convex portion on an upper surface thereof, and the convex portion is inserted into the hole.

3. The storage case according to claim 1, further comprising:
    a through hole extending through the storage case; and
    an RFID tag in the through hole.

4. The storage case according to claim 1, wherein a gripping portion is provided on an outer wall of the storage case.

5. The storage case according to claim 1, wherein
    a portion to be locked is provided in one of the storage case or a feeder; and
    a lock, which engages with the portion to be locked to lock the storage case to the feeder in a state where the storage case is attached to the feeder, is provided in another of the storage case or the feeder.

6. The storage case according to claim 1, wherein an information storage is in the storage case.

7. The storage case according to claim 1, wherein a length of the component in a longitudinal direction is about 1.2 mm or less.

8. The storage case according to claim 1, wherein the component takeout port has a quadrangular or substantially quadrangular shape.

9. The storage case according to claim 1, wherein the inclined surface is inclined at an angle of about 3° to about 10° with respect to a horizontal direction when the storage case is attached to a feeder such that a side of a lower edge of the component takeout port extends in a vertical direction.

10. The storage case according to claim 9, wherein the lower edge of the component takeout port is spaced apart from a bottom surface of the storage case towards an upper side in the vertical direction.

11. The storage case according to claim 9, wherein the inclined surface is inclined at an angle of about 5° to about 7°.

12. The storage case according to claim 10, wherein the lower edge of the component takeout port is spaced apart from a bottom surface of the storage case by a distance of about 3 mm to about 6 mm.

13. The storage case according to claim 4, wherein
    the gripping portion includes an upper gripping portion and a rear gripping portion;
    the upper gripping portion includes recesses on front and rear ends on an upper side of the storage case; and
    the rear gripping portion includes recesses at upper and lower ends on a rear side of the storage case.

* * * * *